United States Patent [19]

Hill et al.

[11] 4,238,436

[45] Dec. 9, 1980

[54] METHOD OF OBTAINING POLYCRYSTALLINE SILICON

[75] Inventors: Lawrence R. Hill, Short Hills, N.J.; Dennis Garbis, Dix Hills; Robert Heller, Levittown, both of N.Y.

[73] Assignee: General Instrument Corporation, Clifton, N.J.

[21] Appl. No.: 37,864

[22] Filed: May 10, 1979

[51] Int. Cl.³ .......................................... H01L 21/205
[52] U.S. Cl. ....................................... 264/81; 264/36; 264/162; 264/139; 264/138; 427/86; 427/93; 427/94; 427/140; 427/249
[58] Field of Search .................... 427/86, 140, 249, 93, 427/94; 264/81, 36, 162, 139, 138

[56] References Cited

U.S. PATENT DOCUMENTS

| | | | |
|---|---|---|---|
| 3,686,378 | 8/1972 | Dietze | 264/81 |
| 3,867,497 | 2/1975 | Teich | 264/81 |
| 4,027,053 | 5/1977 | Lesk | 427/86 |
| 4,065,533 | 12/1977 | Köppl et al. | 264/81 |
| 4,131,659 | 12/1978 | Authier et al. | 427/86 |
| 4,141,764 | 2/1979 | Authier et al. | 427/86 |

*Primary Examiner*—John D. Smith
*Attorney, Agent, or Firm*—James & Franklin

[57] ABSTRACT

Polycrystalline silicon is obtained by providing a silicon wafer having disposed over at least one face thereof a base coating of oxide, nitride or oxynitride composition, forming a substantially pinhole-free and scratch-free layer of carbon on said base coating over at least the face, forming on the face of the carbon layer a layer of polycrystalline silicon, and removing the silicon layer from the protective coating. Any of the carbon layer adhering to the silicon layer is easily removable to provide the silicon layer separate from the substrate. The wafer/coating unit is reusable in the procedure. The wafer/coating/carbon layer unit comprises a workpiece useful in the practice of the invention.

17 Claims, 5 Drawing Figures

METHOD OF OBTAINING POLYCRYSTALLINE SILICON

BACKGROUND OF THE INVENTION

The present invention relates to a method of obtaining polycrystalline silicon, and more particularly to a method of separating polycrystalline silicon from the substrate on which it is grown, and a workpiece useful in the practice of the method.

Sheets of polycrystalline silicon are used for many applications, one of the applications being in solar cells or photovoltaics. A major factor limiting the use of such sheets in solar cells is the high cost of obtaining a sheet separated from the substrate upon which it is formed. For example, formation of a sheet directly on an expensive highly polished silicon wafer substrate makes it impossible to separate the sheet from the substrate. At the very least, the substrate must be cleaned and repolished after each use.

In an attempt to ameliorate this problem, the wafer has been provided with an oxide, nitride or oxynitride coating and then the sheet formed directly on top of the coating. This has not proven satisfactory as the sheet adheres tightly to the coating and it is almost impossible to remove the sheet from the coating without damaging both the sheet and the coating.

It is known that germanium grown on a thick layer of carbon over a substrate is easily separable from the quartz substrate. In an attempt to ameliorate the problem described above by use of this approach, a highly polished silicon wafer has been coated with carbon and then a sheet of polycrystalline silicon formed directly on top of the carbon layer. While this approach enabled easy separation of the sheet from the carbon layer when the carbon layer was essentially free from pinholes, an essentially pinhole-free carbon layer could be obtained only when the carbon layer was so thick that it was difficult to obtain the necessary flatness in the upper surface thereof and the process was economically unattractive due to the increased power requirements for heating the wafer/carbon unit during the growth step. Furthermore, it was difficult to remove the carbon adhering to the wafer after sheet separation, possibly due to the formation of silicon carbide compounds. In brief, this approach was not suitable for mass production techniques.

Accordingly, it is an object of the present invention to provide a method of obtaining a sheet of polycrystalline silicon which enables easy separation of the sheet from the substrate wafer.

Another object is to provide such method in which the substrate, or at least a major portion thereof, is reusable.

A further object is to provide such a method which is economical and adapted to mass production techniques.

A final object is to provide a workpiece which is useful in the practice of such a method and enables easy separation of the sheet from the substrate wafer.

SUMMARY OF THE INVENTION

It has now been found that the above and related objects of the present invention are obtained by providing a substrate comprising a wafer having a base coating of oxide, nitride or oxynitride on top thereof, and forming a layer of carbon on top of the coating and then a layer of polycrystalline silicon on top of the carbon layer. The silicon layer is then easily separable from the wafer and base coating—for example, by wedging one or more thin objects substantially intermediate the silicon layer and the base coating.

While it has been learned that neither the base coating nor the carbon layer by itself enables easy removal of the silicon layer from the wafer, and that the combination of the two does enable such easy removal, it is not fully understood why the combination of the two is operable and each individually is not.

More particularly, the method of obtaining polycrystalline silicon comprises the steps of providing a substrate body having a substantially planar face and a sidewall. A base coating of a composition selected from the group consisting of oxide, nitride and oxynitride compositions is disposed over at least the entire substrate body face, and preferably also the sidewall thereof. A substantially pinhole-free and scratch-free layer of carbon is formed on the base coating over at least the entire face thereof, and preferably also the sidewall thereof. A layer of polycrystalline silicon is then formed on the face of the carbon layer. Finally, the silicon layer is removed from the protective coating.

Any of the carbon layer adhering to the base coating face is removed and the procedure repeated, starting with reconstitution of the carbon layer. Any of the carbon layer adhering to the silicon layer is removed in order to provide a silicon layer or sheet free from its substrate.

The method described above may be repeated a plurality of times until the base coating deteriorates, at which point the base coating is reconstituted and the procedure repeated.

In a preferred embodiment, in order to separate the silicon layer and the base coating, a thin object is wedged between the silicon layer and the base coating, preferably immediately below the portion of the silicon layer abutting the carbon layer face.

Preferably the carbon layer is formed by exposing the base coating face and sidewall to the fumes of ignited xylene, or, alternatively, by heating and exposing to xylene the base coating face and sidewall.

Preferably the substrate body is formed of silicon, the substrate body face is highly polished, the base coating is substantially pinhole-free and scratch-free, and the carbon layer is of uniform thickness.

The workpiece of the present invention comprises a substrate body having a substantially planar upper face and a sidewall, a base coating of the aforementioned composition disposed over at least the entire body face (and preferably also the sidewall thereof), and a substantially pinhole-free and scratch-free layer of carbon disposed over at least the entire exposed base coating face (and preferably also the sidewall thereof). In a later stage of the method of the present invention the workpiece further includes a layer of polycrystalline silicon disposed over at least the exposed face of the carbon layer.

DETAILED DESCRIPTION OF THE PREFERRED EMBODIMENTS

Figure 1:
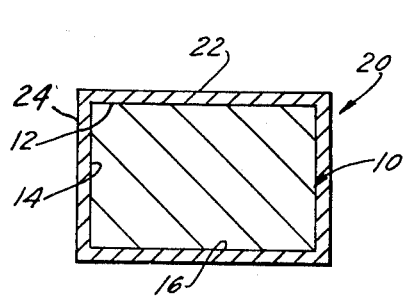
FIG. 1 is a front elevation view of a silicon wafer having a base coating thereon, according to the principles of the present invention.

Referring now to the drawing, and in particular to FIG. 1 thereof, therein illustrated is a substrate body in the form of a silicon wafer, generally designated 10. Preferably the wafer 10 has the substantially planar upper face 12 thereof, and typically the sidewall 14, highly polished to provide a flat mirror-like finish. The backside 16 thereof may also be highly polished. The wafer 10 will generally be to uniform thickness (about 250–1000 microns) and may be formed with any suitable diameter (for example, about 15 centimeters).

A base coating, generally designated 20, is disposed at least over the entire wafer face 12 and preferably also over the sidewall 14 thereof. In order to complete sealing of the wafer 10, a useful procedure where the wafer 10 contains dopants, the base coating may also be disposed over the entire wafer backside 16, thereby to encapsulate the wafer 10. The coating 20 is desirably substantially pinhole-free and scratch-free as well as of uniform thickness (generally about 2000–4000 Angstroms). The composition of the coating may be oxide, nitride, or oxynitride. The techniques for depositing such a coating on a wafer are well known in the art and need not be described in detail herein. See, for example, "Silicon Nitride Chemical Vapor Depositions in a Hot Wall Diffusion System", *J. Electrochem. Soc.,* Volume 125, No. 9, pages 1557–1559 (September 1978); "Preparation and Some Properties of Chemically Vapor-Deposited Si-rich $SiO_2$ and $Si_3N_4$ Films", *J. Electrochem. Soc.,* Volume 125, No. 5, pages 819–822 (May 1978); "Composition, Chemical Bonding, and Contamination of Low Temperature $SiO_xN_y$ Insulating Films", *J. Electrochem. Soc.,* Volume 125, No. 3, pages 424–430 (March 1978); "Improved Theoretical Predictions For the Steam Oxidation of Silicon at any Elevation", *J. Electrochem. Soc.,* Volume 125, No. 9, pages 1514–1517 (September 1978); and "Chemical Vapor Deposition of Silicon Nitride", *J. Electrochem. Soc.,* Volume 125, No. 9, pages 1525–1529 (September 1978). The coating 20 not only provides a top face 22 and sidewall 24 from which the carbon layer later applied thereto will be easily removable, but it also aids in sealing the wafer 10 to protect the polycrystalline silicon sheet later grown thereon from the deleterious effects of pinholes in the carbon layer and outgassing of the wafer 10 under growth conditions.

Figure 2:
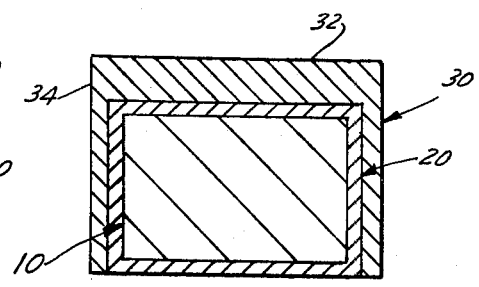
FIG. 2 is a front elevation view of the wafer/coating unit with a layer of carbon disposed thereon.

Referring now in particular to FIG. 2, a substantially pinhole-free and scratch-free layer of carbon, generally designated 30, is then formed over at least the entire upper face 22 of the coating 20, and preferably also the sidewall 24 thereof. The carbon layer 30 is preferably of uniform thickness, thereby to provide a flat upper face 32 on which the polycrystalline silicon sheet can later be grown as well as a sidewall 34 on which some of the polycrystalline silicon may also form. The carbon layer 30 is extremely thin, preferably 12–380 microns in thickness. If the carbon layer is too thick, too much power is required to bring it up to the temperature required for chemical vapor deposition of the polycrystalline silicon sheet and it is difficult to insure uniform flatness of the upper surface 32 on which the sheet is grown. If the carbon layer 30 is too thin, it tends not to be substantially pinhole-free, rendering it difficult to separate the polycrystalline silicon sheet later grown thereon from the coating 20 as described hereinbelow. The carbon layer 30 may also be applied over the base coating on the wafer backside 16, but this is neither necessary nor useful as ordinarily the polycrystalline silicon will not form on the wafer backside.

A variety of different techniques useful in forming the carbon layer 30 will be readily apparent to those skilled in the chemical vapor deposition art. For example, analytical pyrolizing reagent-grade xylene may be ignited under carbonizing conditions. The wafer/protective coating unit may then be held on the wafer backside 16 (for example, by a vacuum chuck) and the front face 22 of the wafer/coating unit passed evenly over the flame to provide a thin uniform carbon layer 30. If necessary, the wafer should be tilted slightly from one side to another to insure that carbon layer 30 is also formed on the coating sidewall 24. Alternatively, the wafer/coating unit may be either rested with its backside 16 lying on a susceptor or suspended with its backside 16 held by a vacuum chuck, and the unit then exposed to a stream of an inert carrier gas which has been bubbled through xylene. In this instance the wafer/coating unit should be heated by conventional means as necessary to maintain the unit at the proper temperature for pyrolitic carbon formation. The carbon layer 30 may also be formed by other techniques such as dipping the appropriate surfaces into carbon powder (graphite) or spraying the appropriate surfaces with an emulsified carbon bath or applying a graphite solution to the appropriate surfaces with a spinner, provided in all instances that the carbon layer 30 thus formed is substantially pinhole-free and scratch-free, and not deleteriously contaminated (e.g., by emulsifiers, solvents and the like), and sufficiently adherent to the coating 20 so that it is not entirely blown away by the gases passing thereby during the later sheet formation step. The wafer/coating/carbon layer unit constitutes the basic workpiece useful in the practice of the method of the present invention.

Figure 3:
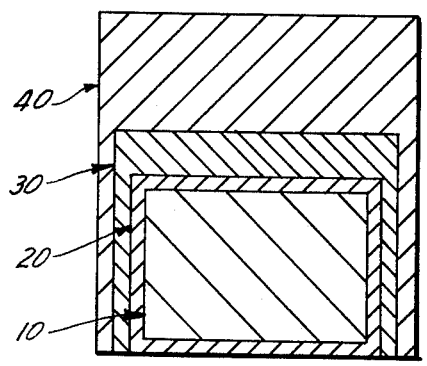
FIG. 3 is a front elevation view of the wafer/coating/carbon unit with a layer of polycrystalline silicon disposed thereon.

Referring now to FIG. 3 in particular, a layer or sheet 40 of polycrystalline silicon is then formed on the upper face 32 of the carbon layer 30, for example, by conventional techniques well known to those skilled in the epitaxy and chemical vapor deposition arts. See, for example, "The Fundamentals of Chemical Vapour Deposition", *Journal of Material Sciences,* 12 (Chapman & Hall Ltd. 1977), pp. 1285–1306. The sheet 40 will typically extend downwardly over the carbon layer sidewall 34, but in a thinner layer. The sheet is generally 250–750 microns thick atop the carbon layer face 32. Thinner sheets have a tendency to warp or break as the sheet is being removed from the substrate as described hereinbelow, while thicker sheets are not economical and are difficult to form with the desired degree of uniform thickness.

Figure 4:
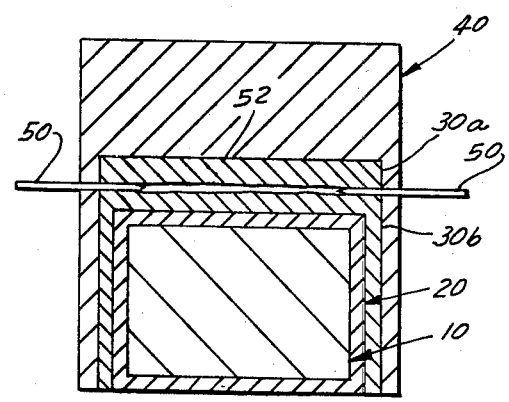
FIG. 4 is a front elevation view similar to FIG. 3, but showing the silicon layer being removed from the wafer/coating unit.
Figure 5:
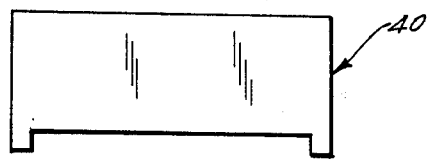
FIG. 5 is a front elevation view of the silicon layer removed from its substrate.

Referring now to FIG. 4 in particular, the polycrystalline silicon sheet 40 is then removed from the wafer/coating unit. As shown, a plurality of substantially uniformly spaced thin objects 50 are wedged intermediate the sheet backside 52 and the coating upper surface 22. The objects 50 may be razor blades or the like having a thickness on the order of about 12 microns. The objects 50 are preferably inserted immediately below the silicon sheet backside 52 abutting the carbon layer face 32. The task of knowing where to position the objects 50 is simplified by the fact that the polycrystalline silicon sheet 40 is gray whereas the carbon layer 30 is black. The actual separation task is simplified by the fact that the polycrystalline silicon layer 40 tends to be rather thin along the carbon layer sidewall 34.

Other techniques presently contemplated for use in separating the sheet 40 from the protective coating 20 include the use of ultrasonics and thermal shock, for example, by rapid chilling of the wafer/coating unit with liquid nitrogen or rapid heating of the wafer/coating unit. The efficacy of these techniques, of course, depends upon the low level of adhesion of the sheet 40 to the coating 20 due to the presence of the intermediate carbon layer 30.

Regardless of the specific technique utilized to separate the sheet 40 from the coating 20, there is likely to be a certain amount 30a of the now destroyed carbon layer 30 adhering to the sheet backside 52 and a certain amount 30b adhering to the coating upper face 22 and sidewall 24. The carbon 30a adhering to the sheet backside 52 may be removed by sandblasting, an acid dip (e.g., using acetic, nitric and hydrofluoric acids), grinding, ultrasonics, a combination thereof, or by other techniques well recognized in the art for removing carbon from a silicon sheet. The silicon sheet is then available for use, separate from its former substrate, as desired.

The carbon 30b adhering to the coating upper face 22 is exposed, but the carbon 30b adhering to the coating sidewall 24 is covered by a thin layer of polycrystalline silicon 40. The thin layer of silicon is removed first, for example, by careful scraping to insure that the coating sidewall 24 is not damaged (although it is immaterial whether or not the intermediate carbon layer sidewall 34 is damaged). Then the carbon 30b is easily removed by simple soft nylon brushing and/or deionized water washing, care being taken to make sure that the carbon removal procedure does not injure the underlying coating 20. The wafer/coating unit is then available for reuse, and the procedure may be repeated starting with formation of the carbon layer 30 on the coating 20, as described hereinabove, to reconstitute the basic workpiece of the present invention. It has been found that the procedure may be repeated many times using the same wafer/coating unit so that the cost of the unit is amortizable over the many silicon sheets obtained by use thereof, this rendering the process economical. If the coating 20 of the wafer/coating unit becomes scratched or otherwise damaged, it is a simple and relatively inexpensive procedure to remove the damaged coating 20 from the wafer 10 and then to apply a fresh coating 20 to the wafer 10, thereby to reconstitute the coating 20 and enable the procedure to restart.

To summarize, the present invention provides an economical process for obtaining a sheet of polycrystalline silicon which enables easy separation of the sheet from the substrate wafer, the substrate wafer being undamaged and reusable in the process, thereby providing an economical mass production technique for obtaining polycrystalline silicon sheet separated from the substrate on which it is grown. The presence of both a base coating and a carbon layer intermediate the substrate wafer and the grown polycrystalline silicon facilitates the separation process.

Now that the preferred embodiments have been shown and described in detail, various modifications and improvements thereon will become readily apparent to those skilled in the art. For example, while the preferred embodiments have been described in terms of a silicon substrate body because only silicon is currently known to be suitable for use as the substrate body in a chemical vapor deposition system for the growth of polycrystalline silicon, the principles of the present invention are equally applicable to substrate bodies formed of materials other than silicon which also meet the requirements for a substrate body useful in a chemical vapor deposition system for the growth of polycrystalline silicon. Accordingly, the spirit and scope of the present invention is to be limited only by the appended claims, and not by the foregoing disclosure.

We claim:

1. A method of obtaining polycrystalline silicon comprising the steps of:
    A. providing a substrate body having a substantially planar face and a sidewall, said substrate body having disposed over at least said face thereof a base coating of a composition selected from the group consisting of oxide, nitride and oxynitride compositions;
    B. forming a substantially pinhole-free and scratch-free layer of carbon on said base coating over at least the face thereof;
    C. forming a layer of polycrystalline silicon on the face of said carbon layer; and
    D. removing said silicon layer from said base coating.

2. The method of claim 1 wherein said base coating is disposed at least over said substrate body face and the sidewall thereof, and said carbon layer is disposed at least over said base coating face and the sidewall thereof.

3. The method of claim 2 wherein said base coating encloses the entire surface of said substrate body.

4. The method of claim 2 including the additional steps of
    E. removing any of said carbon layer adhering to said base coating face; and
    F. repeating at least steps B through D.

5. The method of claim 4 wherein in step (F) steps (B)–(E) are repeated.

6. The method of claim 5 wherein in step (F) steps (B)–(E) are repeated a plurality of times until said base coating deteriorates, at which point said base coating is reconstituted and steps (B)–(E) are repeated.

7. The method of claim 2 additionally including the step of removing any of said carbon layer adhering to said silicon layer after step (D).

8. The method of claim 2 wherein in step (D) a thin object is wedged intermediate said silicon layer and said base coating face.

9. The method of claim 8 wherein in step (D) said thin object is inserted immediately below the portion of said silicon layer abutting said carbon layer face.

10. The method of claim 2 wherein in step (B) said carbon layer is deposited by exposing said base coating face and sidewall to fumes of ignited xylene.

11. The method of claim 2 wherein in step (B) said carbon layer is deposited by heating and exposing to xylene said base coating face and sidewall.

12. The method of claim 2 wherein said silicon layer is formed on said carbon layer face by chemical vapor deposition.

13. The method of claim 2 wherein said substrate body face is highly polished.

14. The method of claim 13 wherein said base coating is substantially pinhole-free and scratch-free.

15. The method of claim 2 wherein said base coating is substantially pinhole-free and scratch-free.

16. The method of claim 2 wherein said carbon layer on said base coating face is of uniform thickness.

17. The method of claim 2 wherein said substrate body is formed of silicon.

* * * * *